United States Patent
Weber

(10) Patent No.: US 10,945,336 B2
(45) Date of Patent: Mar. 9, 2021

(54) ELECTRONIC DEVICE WITH RELAY MOUNTED TO SUBSTRATE

(71) Applicant: TE CONNECTIVITY CORPORATION, Berwyn, PA (US)

(72) Inventor: Ronald Martin Weber, Annville, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/007,017

(22) Filed: Jun. 13, 2018

(65) Prior Publication Data

US 2019/0387627 A1  Dec. 19, 2019

(51) Int. Cl.
   *H05K 1/00*    (2006.01)
   *H05K 1/18*    (2006.01)
   *H01H 50/04*   (2006.01)
   *H01L 23/50*   (2006.01)

(52) U.S. Cl.
   CPC .......... *H05K 1/181* (2013.01); *H01H 50/047* (2013.01); *H01L 23/50* (2013.01); *H05K 2201/09063* (2013.01); *H05K 2201/09072* (2013.01); *H05K 2201/10053* (2013.01); *H05K 2201/10757* (2013.01); *H05K 2201/10818* (2013.01)

(58) Field of Classification Search
   CPC .......... H05K 1/18; H05K 2201/09063; H05K 2201/09072; H05K 2201/10053; H05K 2201/10818; H01H 50/047; H01L 23/50
   See application file for complete search history.

(56) References Cited

U.S. PATENT DOCUMENTS

| 4,091,346 | A | * | 5/1978 | Nishimura | H01H 50/043 335/78 |
| 4,311,976 | A | * | 1/1982 | Sauer | H01H 51/2254 335/179 |
| 6,294,971 | B1 | * | 9/2001 | Martich | H01H 51/281 335/151 |
| 9,761,397 | B1 | * | 9/2017 | Weber | H01H 50/64 |
| 2007/0087585 | A1 | * | 4/2007 | Ota | H01H 51/04 439/57 |

(Continued)

FOREIGN PATENT DOCUMENTS

| EP | 0 763 843 A2 | 3/1997 | |
| EP | 3035352 A1 * | 6/2016 | ........... H01H 1/5805 |

(Continued)

OTHER PUBLICATIONS

RU168167U1 Circuit board with a massive component English Translation; published on Jan. 23, 2017.*

(Continued)

*Primary Examiner* — Pete T Lee

(57) ABSTRACT

An electronic device includes a substrate having a top surface, a bottom surface and at least one opening therethrough. The substrate has circuitry. A relay is mounted to the substrate and is electrically connected to the circuitry. The relay has a switching device configured to activate the relay. The switching device has contacts electrically connected to the circuitry. The relay is mounted to the substrate in the opening such that at least a portion of the switching device is positioned above the top surface and at least a portion of the switching device is positioned below the top surface.

19 Claims, 2 Drawing Sheets

(56) References Cited

U.S. PATENT DOCUMENTS

2010/0124027 A1    5/2010  Handelsman et al.
2016/0286650 A1 *  9/2016  Gingrich, III ......... H05K 1/184
2016/0293365 A1 * 10/2016  Tanaka ................... H01H 47/32

FOREIGN PATENT DOCUMENTS

EP         3035352 A1 *  6/2016
WO    WO 2015/081559 A1 *  6/2015

OTHER PUBLICATIONS

WO 2015/081559 A1 published in 2015.*
RU168167U1 Circuit board with a massive component English Translation; published on Jan. 23, 2017 (Year: 2017).*
International Search Report, International Application No. PCT/IB2019/054919, International Filing Date, Jun. 13, 2018.

* cited by examiner

ELECTRONIC DEVICE WITH RELAY MOUNTED TO SUBSTRATE

BACKGROUND OF THE INVENTION

The subject matter herein relates generally to electronic devices with relays mounted to circuit boards.

Circuit boards have many applications, including use in electronic devices for controlling operations and functions of consumer, commercial and industrial products. Some electronic devices use relays for the switching control of internal and external electrical and electronic circuits. The relays are used to provide isolated switching of electrical circuits and are often employed to enable low voltage electronic devices to switch higher current/voltage circuits. Relays embody a magnetic coil with a switching contact where the coil may be energized by a lower power circuit from the electronic control. The electrically isolated switching contacts are used to switch higher voltage or current circuits. In this manner, a relay mounted to a circuit board and electrically connected to a control circuit of the electronic device is used to switch higher power internal and external circuits. For example, some electronic devices, such as thermostats use relays to switch power to HVAC equipment and control the equipment through relay on and off switching. Some applications prefer electronic devices having low profiles. However, the relays are typically mounted to the top surface of the circuit board and the height of the relays adds to the overall profile of the electronic device.

A need remains for electronic devices having low profiles for use in some applications.

BRIEF DESCRIPTION OF THE INVENTION

In one embodiment, an electronic device is provided including a substrate having a top surface, a bottom surface and at least one opening therethrough. The substrate has circuitry. A relay is mounted to the substrate and is electrically connected to the circuitry. The relay has a switching device configured to activate the relay. The switching device has contacts electrically connected to the circuitry. The relay is mounted to the substrate in the opening such that at least a portion of the switching device is positioned above the top surface and at least a portion of the switching device is positioned below the top surface.

In another embodiment, an electronic device is provided including a substrate having a top surface, a bottom surface and at least one opening therethrough. The substrate has circuitry. A relay is mounted to the substrate and is electrically connected to the circuitry. The relay has a switching device configured to activate the relay. The switching device has contacts electrically connected to the circuitry. The relay is mounted to the substrate in the opening such that the switching device is arranged within the thickness profile of the substrate.

DETAILED DESCRIPTION OF THE INVENTION

Figure 1:
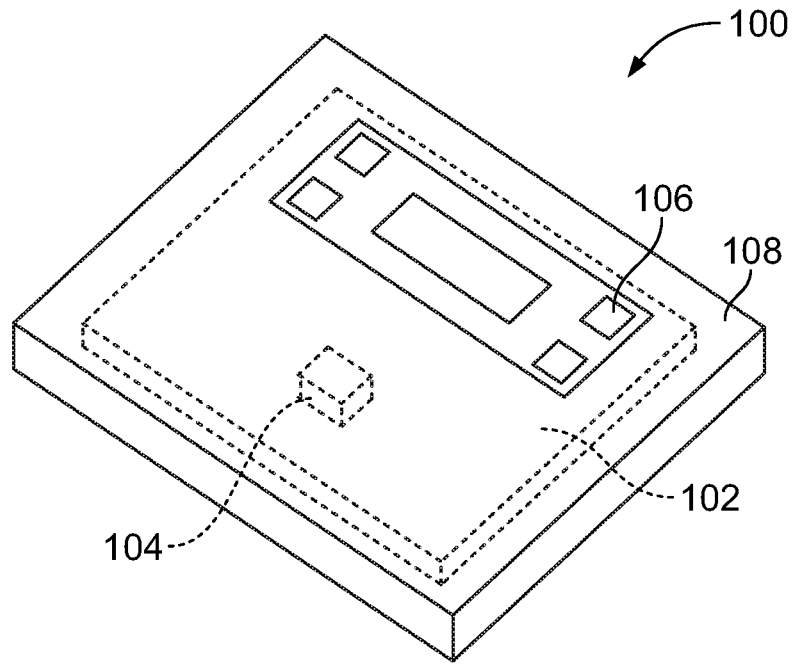
FIG. 1 is an exploded perspective view of an electronic device formed in accordance with one embodiment.

FIG. 1 is an exploded perspective view of an electronic device 100 formed in accordance with one embodiment. The electronic device 100 includes a substrate 102 to which electrical components are connected (e.g., an assembly containing conductive elements), such as, but not limited to, a circuit board, which may be a 2D or 3D included circuit board, a rigid circuit board or a flexible circuit board. Other types of substrates include a molded interconnect device, or other types of devices. While the embodiments illustrated herein are in reference to a circuit board and referred to hereinafter as circuit board 102, the subject matter herein is not intended to be limited to circuit boards. The electronic device 100 includes one or more relays 104 mechanically and electrically coupled to the circuit board 102. The relay 104 is used to control operation of the electronic device 100. For example, the relay 104 is used to relay one or more circuits of the electronic device 100 on or off. Optionally, the electronic device 100 may include a user input 106 used to control operation of the electronic device 100. The user input 106 may be a keypad, toggle buttons, rocker buttons, rotating buttons, slide buttons, molded domes, and the like. In the illustrated embodiment, the electronic device 100 includes a housing 108 holding the circuit board 102.

In various embodiments, the electronic device 100 may be a thermostat and the relay 104 may be used to relay on or off one or more components such as a pump, a fan or another component associated with the thermostat. The electronic device 100 may be used in other types of systems in other various embodiments and is not limited to use in a thermostat.

Figure 2:
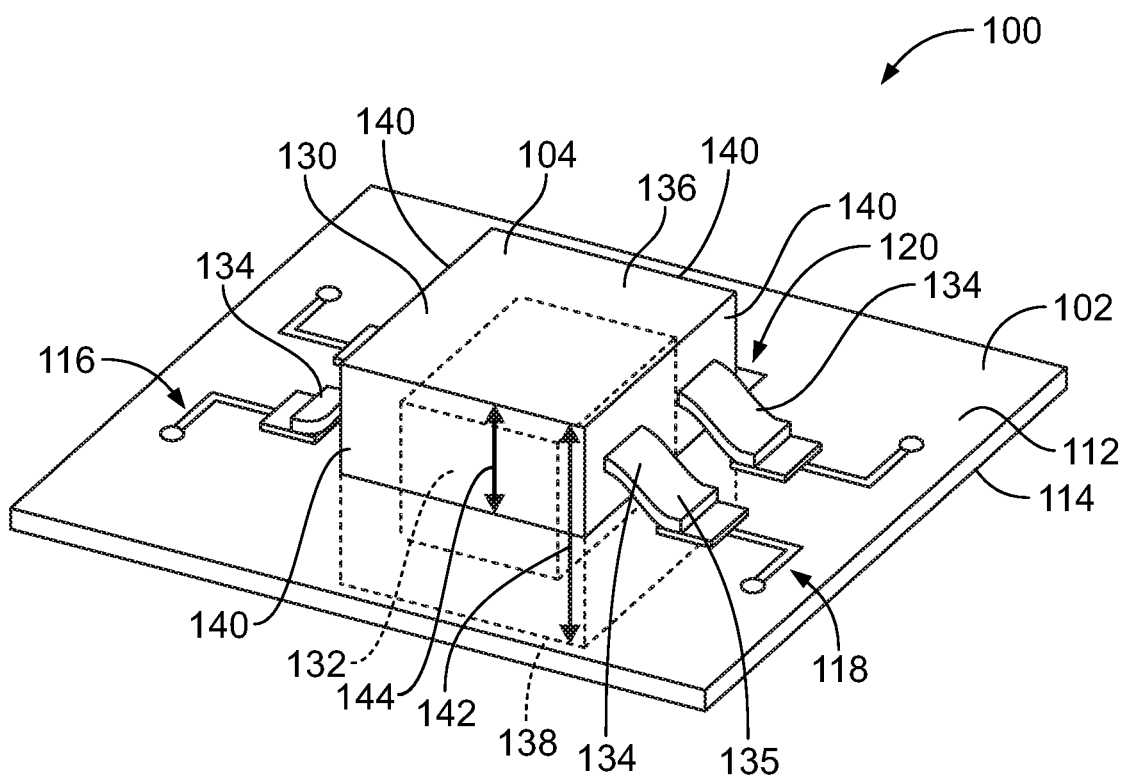
FIG. 2 is a perspective view of a portion of the electronic device in accordance with an exemplary embodiment showing a circuit board and a relay.

FIG. 2 is a perspective view of a portion of the electronic device 100 in accordance with an exemplary embodiment showing the circuit board 102 and the relay 104. The circuit board 102 includes a top surface 112 and a bottom surface 114 opposite the top surface 112. Optionally, the top surface 112 may be upward facing and the bottom surface 114 may be downward facing; however other orientations are possible in alternative embodiments. The circuit board 102 includes one or more input circuit(s) 116 and one or more output circuit(s) 118. The relay 104 is electrically connected to the corresponding input and output circuits 116, 118. The circuits 116, 118 may be printed circuits printed on one or more layers of the circuit board 102. The circuits 116, 118 may include traces (such as on the top surface 112, the bottom surface 114 or other layers of the circuit board 102), pads (such as for mounting the relays 104 to the circuits 116, 118), vias (such as for routing between layers of the circuit board 102), electrical components (such as resistors, transistors, capacitors, and the like), and the like.

The relay 104 is mechanically and electrically connected to the circuit board 102, such as to the corresponding input circuit 116 and the corresponding output circuit 118 of the circuit board 102. For example, the relay 104 may be soldered to the circuit board 102. The input circuit 116 drives the operation of the relay 104 to open and close the output circuit 118. In an exemplary embodiment, the relay 104 has a low profile to reduce the overall height or thickness of the electronic device 100. For example, in an exemplary embodiment, the relay 104 is at least partially recessed relative to the top surface 112 of the circuit board 102. At least a portion of the relay 104 is received in an opening 120 in the circuit board 102. The relay 104 may be suspended in the opening 120. Optionally, the relay 104 may be approximately centered with the thickness of the circuit board 102. For example, the relay 104 may protrude below the bottom surface 114 of the circuit board 102 and may protrude above the top surface 112 of the circuit board 102. The overall height of the electronic device 100 may be shortened by lowering the relay 104 into the opening 120 in the circuit board 102.

The relay 104 includes a a switching device 132 that may be operated to switch the relay 104. In an exemplary embodiment, the switching device 132 of the relay 104 includes a housing 130 covering and/or holding the working components of the switching device 132. However, in alternative embodiments, the relay 104 may be open frame without a housing 130 covering the switching device 132. In various embodiments, the relay 104 is an electromagnetic relay, such as including a solenoid. The relay 104 may be a mechanical relay. For example, the switching device 132 may include a movable armature, contactor and spring. In various embodiments, the relay 104 may be a solid state relay. For example, the switching device 132 may include a solid state element. The relay 104 includes a plurality of contacts 134 electrically connected to the switching device 132. The contacts 134 extend from the housing 130. The contacts 134 are configured to be electrically connected to corresponding mounting pads and traces of the circuits 116, 118. The contacts 134 may be arranged in pairs, such as input contacts and output contacts. In the illustrated embodiment, the contacts 134 are conductive solder tails having corresponding mounting pads 135 for surface mounting and soldering to corresponding mounting pads of the circuit 116, 118. However, other types of contacts may be used in alternative embodiments, such as spring beams, compliant pins, and the like.

In an exemplary embodiment, the housing 130 includes and/or is formed from a dielectric material, such as a plastic material. The relay 104 extends between a top 136 and a bottom 138. The switching device 132 is provided between the top 136 and the bottom 138. The top 136 may be oriented generally parallel to the top surface 112 of the circuit board 102. The contacts 134 extend from sides 140 of the housing 130. Optionally, the contacts 134 may extend generally from the middle of the sides 140, such as approximately centered between the top 136 and the bottom 138; however, the contacts 134 may extend from the sides 140 near the top 136 or near the bottom 138. Alternatively, the contacts 134 may extend from the top 136 and/or the bottom 138, as opposed to the sides 140, and may be bent outward. Various contacts 134 may be electrically connected by the switching device 132 when the relay 104 is activated and may be electrically isolated when the relay 104 is deactivated. In embodiments that do not include the housing 130, the components of the switching device 132 may define the top 136, the bottom 138 and the sides 140 of the relay 104.

The sides 140 have a height 142 between the top 136 and the bottom 138. In an exemplary embodiment, the sides 140 face the circuit board 102 within the opening 120. Because the relay 104 is received in the opening 120, the effective height 144 of the relay 104 from the top of the board 112 is reduced. For example, the top 136 of the relay 104 is lowered by lowering the position of the bottom 138 into the opening 120 and/or below the bottom surface 114 of the circuit board 102. The top 136 of the relay 104 may be positioned coplanar with the next tallest electrical component extending from the top surface 112 of the circuit board 102 so as to not increase the overall height of the electronic device 100 and/or the bottom 138 of the relay 104 may be positioned coplanar with the next tallest electrical component extending from the bottom surface 114 of the circuit board 102 so as to not increase the overall height of the electronic device 100.

Figure 3:
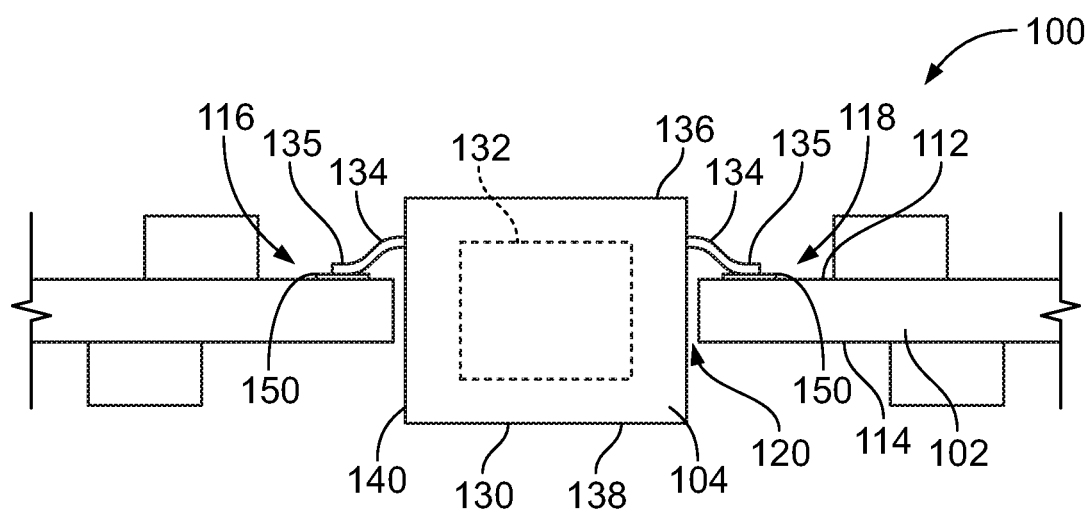
FIG. 3 is a cross-sectional view of a portion of the electronic device showing the relay mounted to the circuit board.

FIG. 3 is a cross-sectional view of a portion of the electronic device 100 showing the relay 104 mounted to the circuit board 102. The relay 104 is shown mounted in the opening 120 in the circuit board 102. In an exemplary embodiment, the relay 104 is approximately centered relative to the circuit board 102 such that approximately equal amounts of the relay 104 extend above the top surface 112 of the circuit board 102 and extend below the bottom surface 114 of the circuit board 102.

The opening 120 extends entirely through a thickness profile of the circuit board 102 between the top surface 112 and the bottom surface 114. The opening 120 may have any size or shape, such as a complementary size and shape to the relay 104, to receive the relay 104. In the illustrated embodiment, the opening 120 is rectangular in shape; however, the opening 120 may have other shapes in alternative embodiments. The opening 120 may be slightly oversized compared to the relay 104 to allow the relay 104 to be freely positionable within the opening 120, such as for aligning the relay 104 with the circuits 116, 118. In other various embodiments, the opening 120 may be sized to hold the relay 104 by an interference fit or through latching features.

In the illustrated embodiment, the bottom 138 of the relay 104 is recessed relative to the top surface 112 of the circuit board 102 to reduce the profile or height of the electronic device 100. For example, the bottom 138 of the relay 104 is positioned below the top surface 112. At least a portion of the relay 104 may be within the thickness profile of the circuit board 102. For example, a portion of the switching device 132 may be within the thickness profile of the circuit board 102. Optionally, the bottom 138 may protrude below the bottom surface 114 of the circuit board 102 and the top 136 of the housing 130 may protrude above the top surface 112 of the circuit board 102.

The contacts 134 extend from the sides 140 of the housing 130. The mounting pads 135 of the contacts 134 are provided along lower surfaces of the contacts 134 and face downward. The mounting pads 135 are electrically and mechanically connected to corresponding mounting pads 150 of the circuits 116, 118. The mounting pads 150 are provided on the top surface 112. In an exemplary embodiment, the mounting pads 135 are soldered to the mounting pads 150. The mounting pads 135 may be mechanically and electrically connected to the mounting pads 150 by other processes in alternative embodiments. The mounting pads 150 may be electrically connected to conductors or traces of the circuit 116, 118 on interior layers or on the bottom surface 114 using conductive vias (not shown) extending through the circuit board 102. Optionally, the relays 104 may be supported on the circuit board 102, such as by a mounting tab extending from the housing 130 such that the solder joints between the mounting pads 135, 150 are not over stressed during actuation.

In the illustrated embodiment, the mounting pads 135 of the contacts 134 are positioned below the top 136 of the housing 130 of the relay 104 and above the bottom 138 of the housing 130. For example, the contacts 134 extend outward from the sides 140 of the housing 130 and are bent downward to position the mounting pads 135 at an appropriate position to locate the relay 104 within the opening 120. Other electrical components may be provided below the bottom surface 114 of the circuit board 102. The relay 104 may have a lower profile than such electrical components such that the relay 104 does not increase the profile of height of the electronic device 100. Recessing the relay 104 and providing the relay 104 below the circuit board 102 reduces the effective protruding height of the relay 104 above the circuit board 102 as compared to conventional electronic devices 100 that surface mount relays 104 to the top surface 112, wherein the entire height or thickness of the relay 104 adds to the protruding height above the top surface of such circuit boards. As such, the electronic device 100 having the relay 104 at least partially recessed within the opening 120 reduces an overall profile or height of the electronic device 100 as compared to conventional electronic devices.

Figure 4:
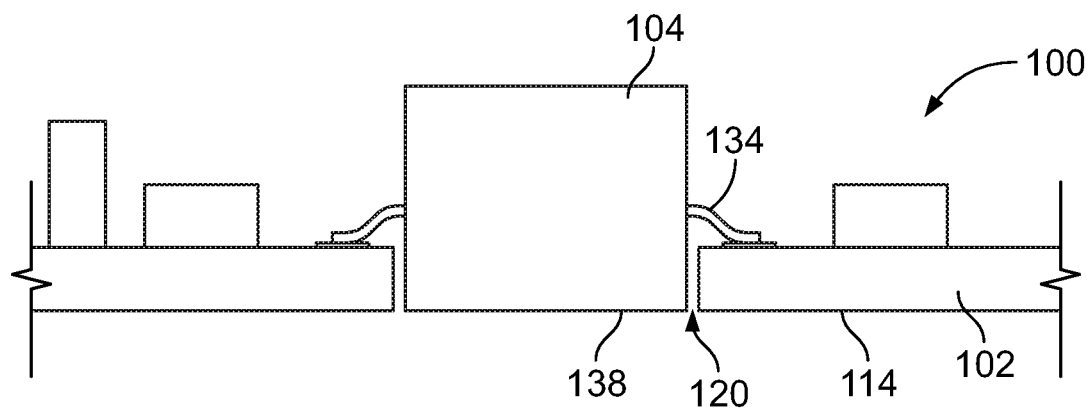
FIG. 4 is a cross-sectional view of a portion of the electronic device showing the relay mounted to the circuit board in accordance with an exemplary embodiment.

FIG. 4 is a cross-sectional view of a portion of the electronic device 100 showing the relay 104 mounted to the circuit board 102 in accordance with an exemplary embodiment. In the illustrated embodiment, the bottom 138 of the relay 104 is mounted flush with the bottom surface 114 of the circuit board 102. In the illustrated embodiment, the circuit board 102 does not include any electrical components mounted to the bottom surface 114, although they may be present in various applications. The effective height of the electronic device 100 is reduced by the thickness of the circuit board 102 by lowering the relay 104 into the opening 120 a distance equal to the thickness of the circuit board 102.

Figure 5:
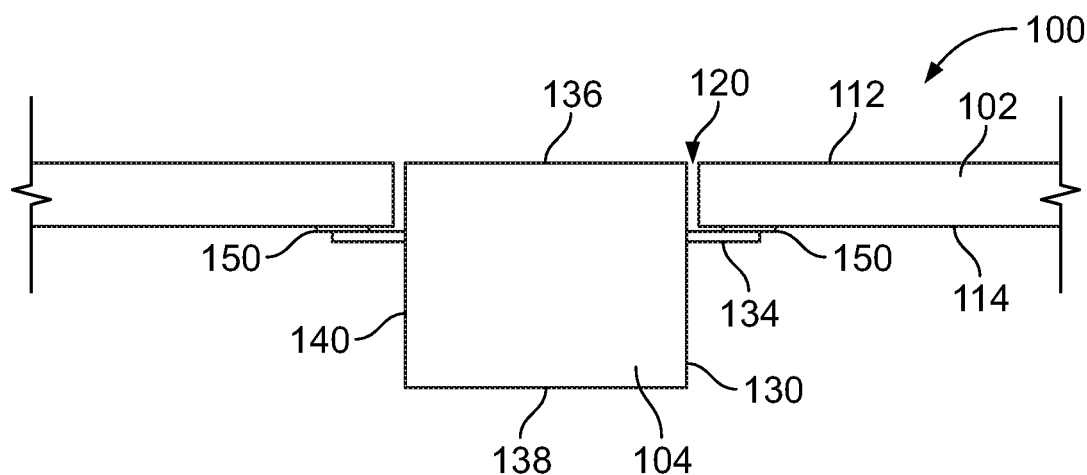
FIG. 5 is a cross-sectional view of a portion of the electronic device showing the relay mounted to the circuit board in accordance with an exemplary embodiment.

FIG. 5 is a cross-sectional view of a portion of the electronic device 100 showing the relay 104 mounted to the circuit board 102 in accordance with an exemplary embodiment. In the illustrated embodiment, the top 136 of the relay 104 is mounted flush with the top surface 112 of the circuit board 102. However, the circuit board 102 does not include any electrical components mounted to the top surface 112. The bottom 138 of the relay 104 extends below the bottom surface 114 of the circuit board 102. In the illustrated embodiment, the contacts 134 are terminated to the mounting pads 150 on the bottom surface 114. Optionally, the contacts 134 may extend straight from the sides 140 of the housing 130. The effective height of the electronic device 100 is reduced by the thickness of the circuit board 102 by lowering the relay 104 into the opening 120 a distance equal to the thickness of the circuit board 102.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electronic device comprising:
   a substrate having a top surface, a bottom surface and at least one opening therethrough, the substrate having circuitry forming a power circuit; and
   a relay mounted to the substrate and electrically connected to the circuitry, the relay having a switching device configured to activate the relay, the switching device having contacts forming a power control circuit through the switching device, the contacts extending between first ends and second ends, the first ends extending from sides of the switching device and the second ends being terminated to the substrate for direct electrical connection to the power circuit of the circuitry to electrically connect the power control circuit of the switching device to the power circuit of the substrate for control of the power circuit by the switching device, the relay being mounted to the substrate in the opening such that at least a portion of the switching device is positioned above the top surface and at least a portion of the switching device is positioned below the bottom surface, wherein a top of the switching device is positioned above the upper surface a first distance and a bottom of the switching device is positioned below the bottom surface a second distance, the first distance being approximately equal to the second distance.

2. The electronic device of claim 1, wherein the switching device extends entirely through the substrate in the opening.

3. The electronic device of claim 1, wherein at least a portion of the switching device is positioned above the bottom surface and at least a portion of the switching device is positioned below the bottom surface.

4. The electronic device of claim 1, wherein the switching device is suspended in the opening by the contacts.

5. The electronic device of claim 1, wherein the contacts are terminated to the circuitry at the top surface of the substrate.

6. The electronic device of claim 1, wherein the contacts extend from the sides at an elevation above the top surface of the substrate.

7. The electronic device of claim 1, wherein the sides face the opening.

8. The electronic device of claim 1, wherein the contacts have mounting pads positioned above the bottom of the switching device of the relay and positioned below the top of the switching device of the relay.

9. The electronic device of claim 1, wherein the opening is provided at an edge of the substrate, the edge defining a thickness profile of the substrate between the top surface and the bottom surface, the switching device being positioned within the thickness profile of the substrate.

10. The electronic device of claim 9, wherein the switching device extends outward beyond the edge.

11. The electronic device of claim 1, wherein the switching device includes a housing forming the top, the bottom and the sides, at least a portion of the housing is positioned above the top surface and at least a portion of the housing is positioned below the bottom surface.

12. The electronic device of claim 1, wherein the switching device includes a solid state element.

13. The electronic device of claim 1, wherein the switching device includes a solenoid.

14. An electronic device comprising:
a substrate having a top surface, a bottom surface and having a thickness profile defined between the top surface and the bottom surface of the substrate, the substrate having an opening therethrough, the substrate having circuitry forming a power circuit; and
a relay received in the opening and electrically connected to the power circuit of the circuitry to control the power circuit, the relay having a switching device configured to activate the relay, the switching device having contacts extending from the switching device electrically connected to the power circuit of the circuitry, the relay being mounted to the substrate in the opening such that the switching device is arranged within the thickness profile of the substrate substantially centered relative to the substrate, wherein a top of the switching device is positioned above the upper surface a first distance and a bottom of the switching device is positioned below the bottom surface a second distance, the first distance being approximately equal to the second distance.

15. The electronic device of claim 14, wherein the relay is mounted to the substrate in the opening such that at least a portion of the switching device is positioned above the top surface and at least a portion of the switching device is positioned below the bottom surface.

16. The electronic device of claim 14, wherein the switching device extends entirely through the substrate in the opening.

17. The electronic device of claim 14, wherein the switching device is suspended in the opening by the contacts.

18. The electronic device of claim 14, wherein the contacts are terminated to the circuitry at the top surface of the substrate.

19. The electronic device of claim 14, wherein the contacts extend from the sides at an elevation above the top surface of the substrate.

* * * * *